(12) United States Patent
Huang et al.

(10) Patent No.: US 11,009,455 B2
(45) Date of Patent: May 18, 2021

(54) PRECURSOR DELIVERY SYSTEM AND METHODS RELATED THERETO

(71) Applicant: Applied Materials, Inc., Santa Clara, CA (US)

(72) Inventors: Zubin Huang, Santa Clara, CA (US); Sarah Langlois White, Sunnyvale, CA (US); Jonathan Robert Bakke, Sunnyvale, CA (US); Diwakar N. Kedlaya, San Jose, CA (US); Juan Carlos Rocha, San Carlos, CA (US); Fang Ruan, Milpitas, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/460,309

(22) Filed: Jul. 2, 2019

(65) Prior Publication Data

US 2020/0041407 A1   Feb. 6, 2020

Related U.S. Application Data

(60) Provisional application No. 62/805,177, filed on Feb. 13, 2019, provisional application No. 62/712,627, filed on Jul. 31, 2018.

(51) Int. Cl.
*G01N 21/3504* (2014.01)
*G01N 21/33* (2006.01)
(Continued)

(52) U.S. Cl.
CPC ....... *G01N 21/3504* (2013.01); *C23C 16/448* (2013.01); *C23C 16/52* (2013.01);
(Continued)

(58) Field of Classification Search
CPC .. G01N 21/3504; G01N 21/33; C23C 16/448; C23C 16/52; H01L 21/02129; H01L 21/67253
See application file for complete search history.

(56) References Cited

U.S. PATENT DOCUMENTS 4,100,310 A * 7/1978 Ura ................... H01L 21/02129
                                                              438/5
5,980,608 A    11/1999 Dietz et al.
(Continued)

FOREIGN PATENT DOCUMENTS

JP    2018063205 A    4/2018

OTHER PUBLICATIONS

Lin, Xiao et al.—"A Survey on Gas Sensing Technology," Sensors 2012, 12, ISSN 1424-8220, published Jul. 16, 2012, pp. 9635-9665.
(Continued)

*Primary Examiner* — Blake C Riddick
(74) *Attorney, Agent, or Firm* — Patterson + Sheridan LLP

(57) ABSTRACT

Systems and methods used to deliver a processing gas having a desired diborane concentration to a processing volume of a processing chamber are provided herein. In one embodiment a system includes a borane concentration sensor. The borane concentration sensor includes a body and a plurality of windows. Here, individual ones of the plurality of windows are disposed at opposite ends of the body and the body and the plurality of windows collectively define a cell volume. The borane concentration sensor further includes a radiation source disposed outside of the cell volume proximate to a first window of the plurality of windows, and a radiation detector disposed outside the cell volume proximate to a second window of the plurality of windows.

17 Claims, 8 Drawing Sheets

(51) Int. Cl.
  *C23C 16/52* (2006.01)
  *H01L 21/67* (2006.01)
  *C23C 16/448* (2006.01)
  *H01L 21/02* (2006.01)

(52) U.S. Cl.
  CPC ....... *G01N 21/33* (2013.01); *H01L 21/02129* (2013.01); *H01L 21/67253* (2013.01)

(56) References Cited

U.S. PATENT DOCUMENTS

| | | | | |
|---|---|---|---|---|
| 5,993,766 | A * | 11/1999 | Tom | C01B 6/10 206/0.7 |
| 6,197,471 | B1 * | 3/2001 | Graham | C23C 14/165 204/192.23 |
| 6,391,690 | B2 * | 5/2002 | Miyasaka | C23C 16/0209 257/E21.101 |
| 6,410,090 | B1 * | 6/2002 | Wang | C23C 16/24 257/E21.101 |
| 7,648,927 | B2 * | 1/2010 | Singh | H01L 21/02636 438/792 |
| 7,651,955 | B2 * | 1/2010 | Ranish | C23C 16/45519 438/769 |
| 7,939,447 | B2 * | 5/2011 | Bauer | H01L 21/02535 438/680 |
| 2002/0152797 | A1 | 10/2002 | McAndrew et al. | |
| 2003/0017267 | A1 | 1/2003 | Mukai et al. | |
| 2004/0007180 | A1 | 1/2004 | Yamasaki et al. | |
| 2004/0015300 | A1 | 1/2004 | Ganguli et al. | |
| 2004/0118342 | A1 | 6/2004 | Cheng et al. | |
| 2006/0012794 | A1 | 1/2006 | Arno | |
| 2006/0017055 | A1 * | 1/2006 | Cropper | H01L 51/56 257/77 |
| 2006/0115591 | A1 * | 6/2006 | Olander | C23C 16/4485 427/248.1 |
| 2006/0234504 | A1 * | 10/2006 | Bauer | C23C 16/04 438/674 |
| 2006/0286776 | A1 * | 12/2006 | Ranish | H01L 21/02164 438/478 |
| 2007/0010033 | A1 * | 1/2007 | Aderhold | C30B 25/02 438/14 |
| 2007/0117414 | A1 * | 5/2007 | Moffatt | H01L 21/67069 438/795 |
| 2007/0200065 | A1 | 8/2007 | Arno | |
| 2007/0241280 | A1 * | 10/2007 | Dainobu | G01J 3/02 250/343 |
| 2007/0254093 | A1 | 11/2007 | Nijhawan et al. | |
| 2010/0018460 | A1 * | 1/2010 | Singh | C30B 29/06 118/620 |
| 2010/0062158 | A1 | 3/2010 | Hara et al. | |
| 2010/0285206 | A1 | 11/2010 | Woelk et al. | |
| 2011/0259268 | A1 * | 10/2011 | Foad | G01N 21/59 118/708 |
| 2012/0142172 | A1 * | 6/2012 | Fox | C23C 16/24 438/488 |
| 2013/0157466 | A1 * | 6/2013 | Fox | C23C 16/45523 438/694 |
| 2013/0284090 | A1 | 10/2013 | Balasubramanian et al. | |
| 2013/0330917 | A1 | 12/2013 | Homan et al. | |
| 2014/0087544 | A1 * | 3/2014 | Tolle | H01L 21/02579 438/478 |
| 2015/0226540 | A1 * | 8/2015 | Rajagopalan | G01N 21/55 118/728 |
| 2017/0011917 | A1 * | 1/2017 | Srinivasan | H01L 21/67115 |
| 2017/0352999 | A1 * | 12/2017 | Cormier | G02B 26/001 |
| 2018/0174838 | A1 * | 6/2018 | Ueda | C23C 16/38 |
| 2018/0299369 | A1 * | 10/2018 | Marta | G01N 29/4427 |
| 2018/0305204 | A1 * | 10/2018 | Rohani | C01B 3/065 |

OTHER PUBLICATIONS

LumaSense Technologies, Inc.—"Gas Sensing Solutions Overview" Brochure-Letter-EN Rev. Oct. 2, 2017, 16 pages.
PCT International Search Report and Written Opinion dated Oct. 17, 2019, for International Application No. PCT/US2019/041056.

* cited by examiner

PRECURSOR DELIVERY SYSTEM AND METHODS RELATED THERETO

CROSS-REFERENCE TO RELATED APPLICATIONS

This application claims priority to U.S. Provisional Application Ser. No. 62/712,627 filed on Jul. 31, 2018 and U.S. Provisional Application Ser. No. 62/805,177 filed on Feb. 13, 2019, both of which are herein incorporated by reference in their entireties.

BACKGROUND

Field

Embodiments of the present disclosure generally relate to the field of electronic device manufacturing, and more particularly, to systems and methods used to deliver a processing gas having a desired diborane concentration therein to a processing volume of a processing chamber.

Description of the Related Art

Boron containing (boron doped) material layers, such as boron doped silicon or germanium semiconductor layers, boron doped dielectric layers, boron doped silicon hardmask layers, or boron doped tungsten nucleation layers, are widely used in the field of electronic device manufacturing. Often, boron doped material layers are formed using a chemical vapor deposition (CVD) process where a boron containing gas is reacted with, or dissociated in the presence of, one or more material precursor gases to deposit a boron doped material layer on a surface of a substrate.

Diborane ($B_2H_6$) is commonly chosen as a boron precursor for doping because diborane is relatively easy to store and transport and desirably dissociates at relatively lower temperatures when compared to other boron dopant source gases. Diborane is typically stored in a pressurized gas cylinder with a diluent gas such as one, or a combination, of hydrogen ($H_2$), Argon (Ar), nitrogen ($N_2$), or helium (He) to form a doping gas mixture, i.e., the boron doping gas. The boron doping gas is typically delivered from the pressurized gas cylinder to a processing volume of a CVD processing chamber using a gas delivery conduit fluidly coupled therebetween. Unfortunately, over time, the diborane in the pressurized gas cylinder will undesirably decompose to yield free hydrogen and higher order boranes, thereby resulting in a reduced concentration of diborane therein. This undesirable change in diborane concentration will, over time, cause undesirable substrate to substrate variation of boron concentration in the CVD deposited material layers formed thereon.

Accordingly, what is needed in the art are improved systems for monitoring and controlling diborane concentration in a boron doping gas and methods related thereto.

SUMMARY

Embodiments of the present disclosure generally relate to the field of electronic device manufacturing, and more particularly, to processing systems, diborane sensors, and methods used to deliver a doping gas mixture, having a desired diborane concentration, to a processing volume of a processing chamber.

In one embodiment a borane concentration sensor includes a body and a plurality of windows. Here, individual ones of the plurality of windows are disposed at opposite ends of the body and the body and the plurality of windows collectively define a cell volume. The borane concentration sensor further includes a radiation source disposed outside of the cell volume proximate to a first window of the plurality of windows, and a first radiation detector disposed outside the cell volume proximate to a second window of the plurality of windows.

In another embodiment, a method of processing a substrate includes determining a diborane concentration in a gas sample taken from a gas conduit fluidly coupling a first gas source and a processing chamber. Here, determining the diborane concentration comprises using an optical sensor. The method further includes mixing a boron doping gas, having a desired diborane concentration, by changing a flowrate of a first gas from the first gas source, a second gas from a second gas source, or both and delivering the boron doping gas to a processing volume of the processing chamber.

In another embodiment, a processing system featuring a computer readable medium having instructions stored thereon for a method of processing a substrate is provided. The method includes determining a diborane concentration in a gas sample taken from a gas conduit fluidly coupling a first gas source and a processing chamber. Here, determining the diborane concentration comprises using an optical sensor. The method further includes mixing a boron doping gas, having a desired diborane concentration, by changing a flowrate of a first gas from the first gas source, a second gas from a second gas source, or both and delivering the boron doping gas to a processing volume of the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to the field of electronic device manufacturing. In particular, embodiments herein relate to processing systems, borane concentration sensors, and methods used to deliver a boron doping gas, having a desired diborane concentration, to a processing volume of a processing chamber.

In a typical semiconductor device manufacturing process for depositing borane doped materials, diborane is delivered to a processing volume of a processing chamber from a diborane gas source. The diborane gas source is often a pressurized cylinder comprising diborane and a diluent gas such as hydrogen ($H_2$), Argon (Ar), nitrogen ($N_2$), or helium (He). Unfortunately, over time the diborane in the cylinder will decompose into hydrogen and higher order boranes, e.g., tetraborane, causing undesirable and uncontrollable variation in the ratio of diborane to diluent gas delivered to a process chamber. Therefore, embodiments herein compensate for variations in diborane concentration from the diborane gas source by further mixing the gas provided by the pressurized cylinder with an additional diluent gas to provide a boron doping gas having a desired, and known, diborane concentration.

Herein, the concentration of diborane in the boron doping gas is desirably controlled using in-situ measurements taken by one or more of the borane concentration sensors provided herein. Typically, the one or more borane concentration sensors are light-absorption based sensors, i.e., optical spectrometers. The light-absorption based sensors are configured to selectively measure the absorption of UV or IR radiation (emitted by a radiation source of the sensor) by borane molecules, such as diborane, tetraborane, or both in a gas sample. The concentration of one or both of the diborane and tetraborane molecules is then determined from the measured absorption(s).

Figure 1:
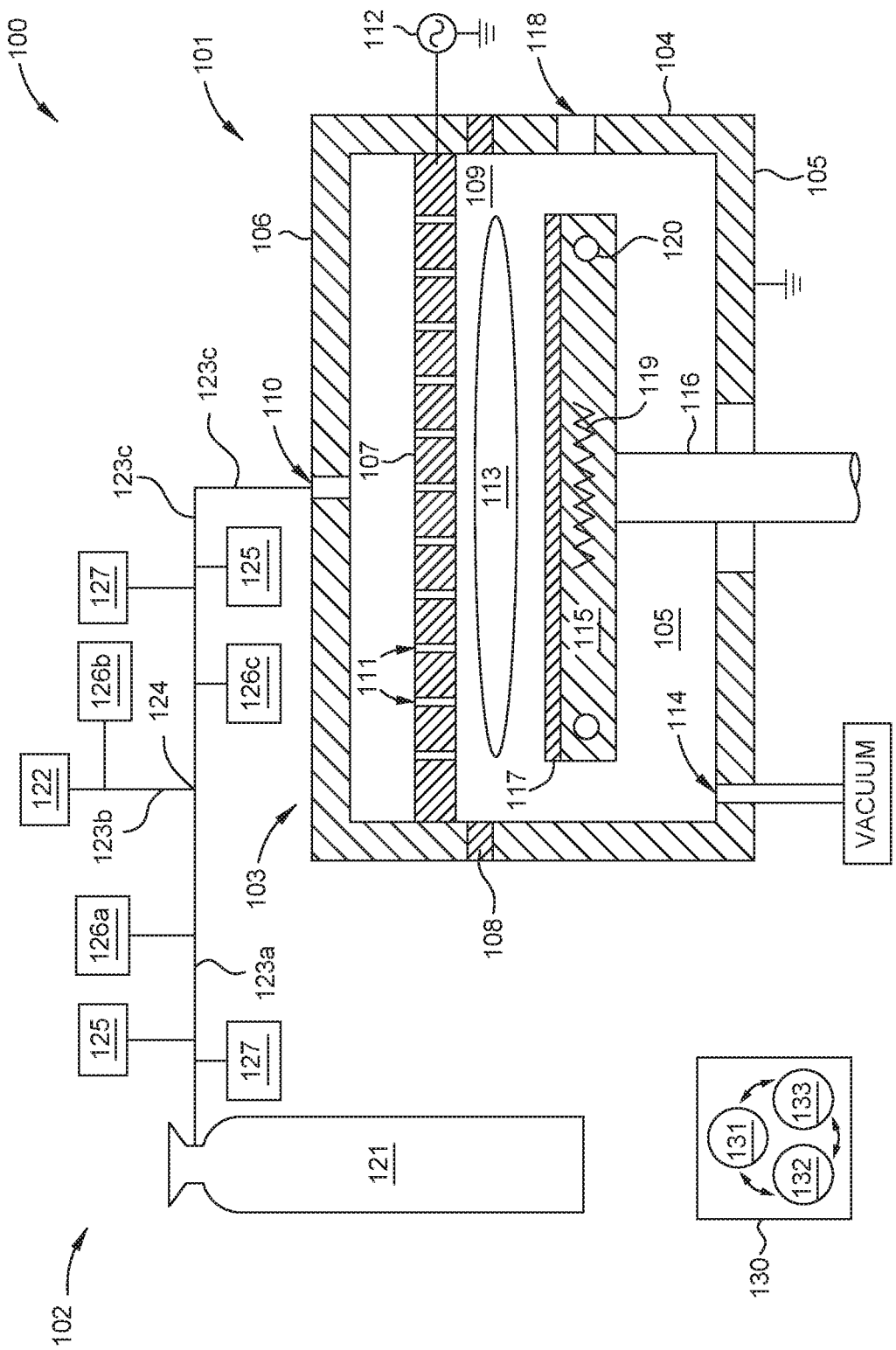
FIG. 1 is a schematic cross-sectional view of a substrate processing system configured to practice the methods set forth herein, according to one embodiment.

FIG. 1 is a schematic cross-sectional view of a substrate processing system 100 configured to practice the methods set forth herein, according to one embodiment. The processing system 100 features a processing chamber 101 and a precursor delivery system 102. Other processing chambers which may be used in combination with the precursor delivery system 102 to practice the methods set forth herein include processing chambers in a Producer® ETERNA CVD® system, an Ultima HDP CVD® system, or a Producer® XP Precision™ CVD system, all available from Applied Materials, Inc., of Santa Clara, Calif. as well as suitable processing chambers from other manufacturers.

The processing chamber 101 includes a chamber lid assembly 103, one or more sidewalls 104, and a chamber base 105. The chamber lid assembly 103 includes a chamber lid 106, a showerhead 107 disposed in the chamber lid 106, and an electrically insulating ring 108, interposed between the chamber lid 106 and the one or more sidewalls 104. The showerhead 107, the one or more sidewalls 104, and the chamber base 105 collectively define a processing volume 109. A gas inlet 110, disposed through the chamber lid 106, is fluidly coupled to the precursor delivery system 102. The showerhead 107, having a plurality of openings 111 disposed therethrough, is used to uniformly distribute processing gases provided by the precursor delivery system 102 into the processing volume 109. In some embodiments, the showerhead 107 is electrically coupled to a first power supply 112, such as an RF power supply, which supplies power to ignite and maintain a plasma 113 of the processing gas through capacitive coupling therewith. In other embodiments, the processing chamber 101 comprises an inductive plasma generator and the plasma is formed through inductively coupling an RF power to the processing gas. In some embodiments, the processing chamber is not a plasma processing chamber.

Herein, the processing volume 109 is fluidly coupled to a vacuum source, such as to one or more dedicated vacuum pumps, through a vacuum outlet 114, which maintains the processing volume 109 at sub-atmospheric conditions and evacuates the processing gas and other gases therefrom. A substrate support 115, disposed in the processing volume 109, is disposed on a movable support shaft 116 sealingly extending through the chamber base 105, such as being surrounded by bellows (not shown) in the region below the chamber base 105. Typically, the processing chamber 101 is configured to facilitate transferring of a substrate 117 to and from the substrate support 115 through an opening 118 in one of the one or more sidewalls 104, which is sealed with a door or a valve (not shown) during substrate processing.

In some embodiments, a substrate 117, disposed on the substrate support 115, is maintained at a desired processing temperature using one or both of a heater, such as a resistive heating element 119, and one or more cooling channels 120 disposed in the substrate support 115. Typically, the one or more cooling channels 120 are fluidly coupled to a coolant source (not shown), such as a modified water source having relatively high electrical resistance or a refrigerant source.

The precursor delivery system 102 features a diborane gas source, e.g., the first gas source 121, a diluent gas source, e.g., the second gas source 122, and first and second delivery conduits 123a-b fluidly coupling the respective first gas source 121 and second gas source 122 to a mixing point 124. The mixing point 124 is fluidly coupled to the processing chamber 101 through a third delivery conduit 123c. The precursor delivery system 102 further includes one or more borane concentration sensors 125, one or more flow controller's 126a-c, and one or more pressure sensors 127, each coupled to a delivery conduit 123a-c at location upstream of the mixing point, downstream of the mixing point, or both.

During substrate processing a first gas comprising an unknown concentration of diborane is flowed from the first gas source 121 into the first delivery conduit 123a and a second gas comprising a diluent is flowed from the second gas source 122 into the second delivery conduit 123b. Typically, the second gas e.g., $H_2$ is not reactive with diborane. The first and second gases mix at the mixing point 124 to form a boron doping gas. The boron doping gas flows from the mixing point 124 into the processing volume 109 through a third delivery conduit 123c fluidly coupled therebetween. The one or more borane concentration sensors 125 are used to determine the concentration of diborane in the first gas from a location upstream of the mixing point 124, determine the concentration of diborane in the boron doping gas (the mixture of the first gas and the second gas) at a location downstream from the mixing point, or both. In some embodiments, one or more of the borane concentration sensors 125 are used to determine the concentration of tetraborane in the first gas or the boron doping gas. One or both of the diborane and tetraborane concentration(s) are communicated to a system controller 130 of the processing system 100 which adjusts the flowrate of one or both of the first gas or second gas using a respective first flow controller 126a or second flow controller 126b.

The system controller 130 includes a programmable central processing unit (CPU 131) that is operable with a memory 132 (e.g., non-volatile memory) and support circuits 133. The support circuits 133 are conventionally coupled to the CPU 131 and comprise cache, clock circuits, input/output subsystems, power supplies, and the like, and combinations thereof coupled to the various components of the processing system 100 to facilitate control thereof. The CPU 131 is one of any form of general purpose computer processor used in an industrial setting, such as a programmable logic controller (PLC), for controlling various components and sub-processors of the processing system 100. The memory 132, coupled to the CPU 131, is non-transitory and is typically one or more of readily available memories such as random access memory (RAM), read only memory (ROM), floppy disk drive, hard disk, or any other form of digital storage, local or remote.

Typically, the memory 132 is in the form of a computer-readable storage media containing instructions (e.g., non-volatile memory), that when executed by the CPU 131, facilitates the operation of the processing system 100. The instructions in the memory 132 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In other embodiments, the methods described herein, or portions thereof, are performed by one or more application specific integrated circuits (ASICs), field-programmable gate arrays (FPGAs), or other types of hardware implementations. In some other embodiments, the processes described herein are performed by a combination of software routines, ASIC(s), FPGAs, or other types of hardware implementations.

Herein, one or more of the borane concentration sensors 125 is an optical sensor configured to selectivity measure the attenuation of one or more specific wavelengths of introduced radiation, i.e., one or more target wavelengths, passing through a gas sample disposed therein. The target wavelength(s) correspond to an absorption peak of the absorption spectrum of a to-be-measured molecular species, i.e., a target molecular species such as diborane or tetraborane. As the concentration of the target molecular species in the sample increases or decreases so does the total absorption of the target wavelength(s), and thus increases or decreases the attenuation of the target wavelength(s) of radiation passing therethrough. In embodiments herein, the selective attenuation measurement(s) are used to determine the concentration of the target molecular species in the gas sample.

Figure 2A:
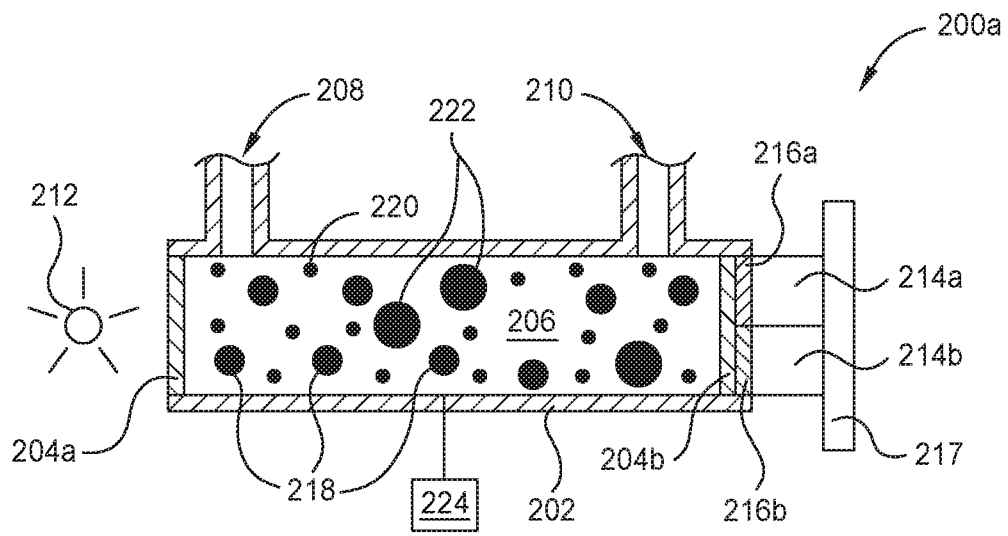
FIG. 2A is a schematic cross-sectional view of an optical sensor, according to one embodiment, which may be used with the substrate processing system described in FIG. 1.
Figure 2B:
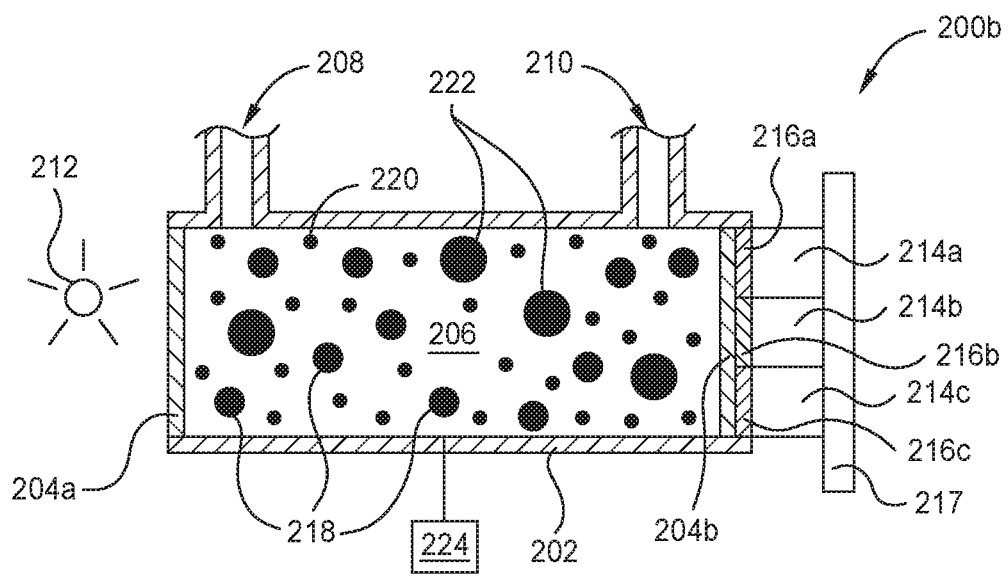
FIG. 2B is a schematic cross-sectional view of an optical sensor, according to another embodiment, which may be used with the substrate processing system described in FIG. 1.
Figure 3:
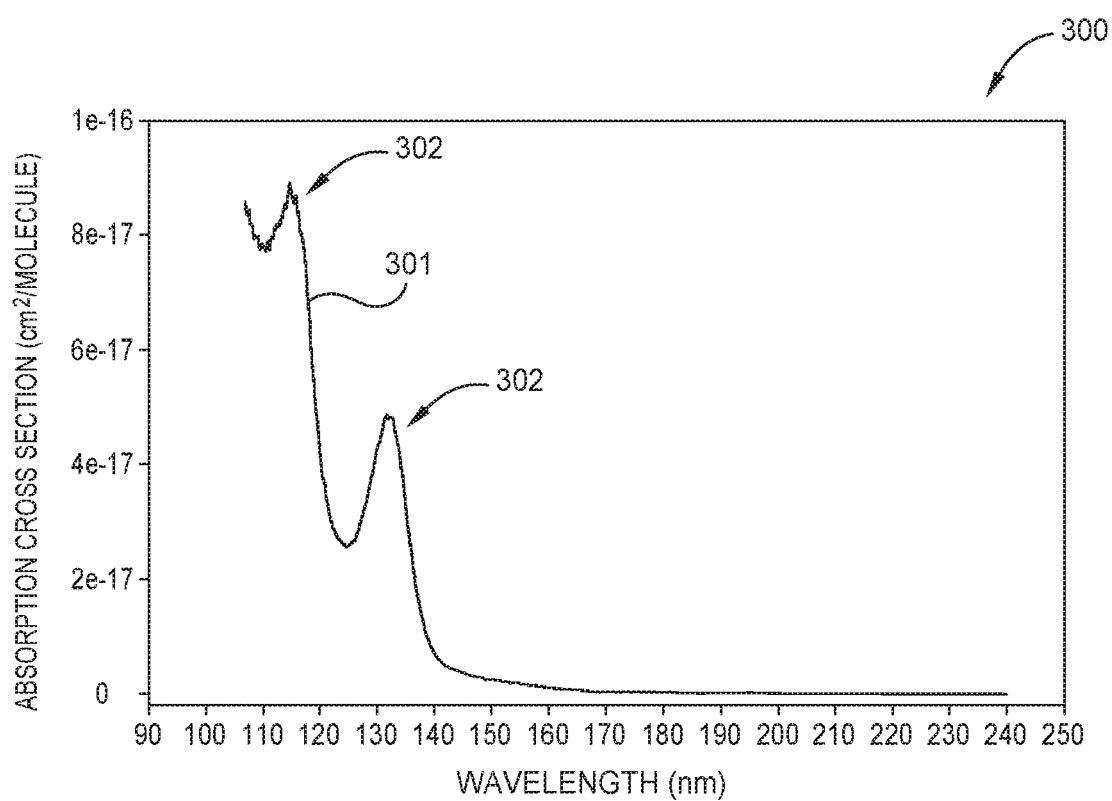
FIG. 3 is a graph illustrating the UV absorption spectrum of diborane.
Figure 4A:
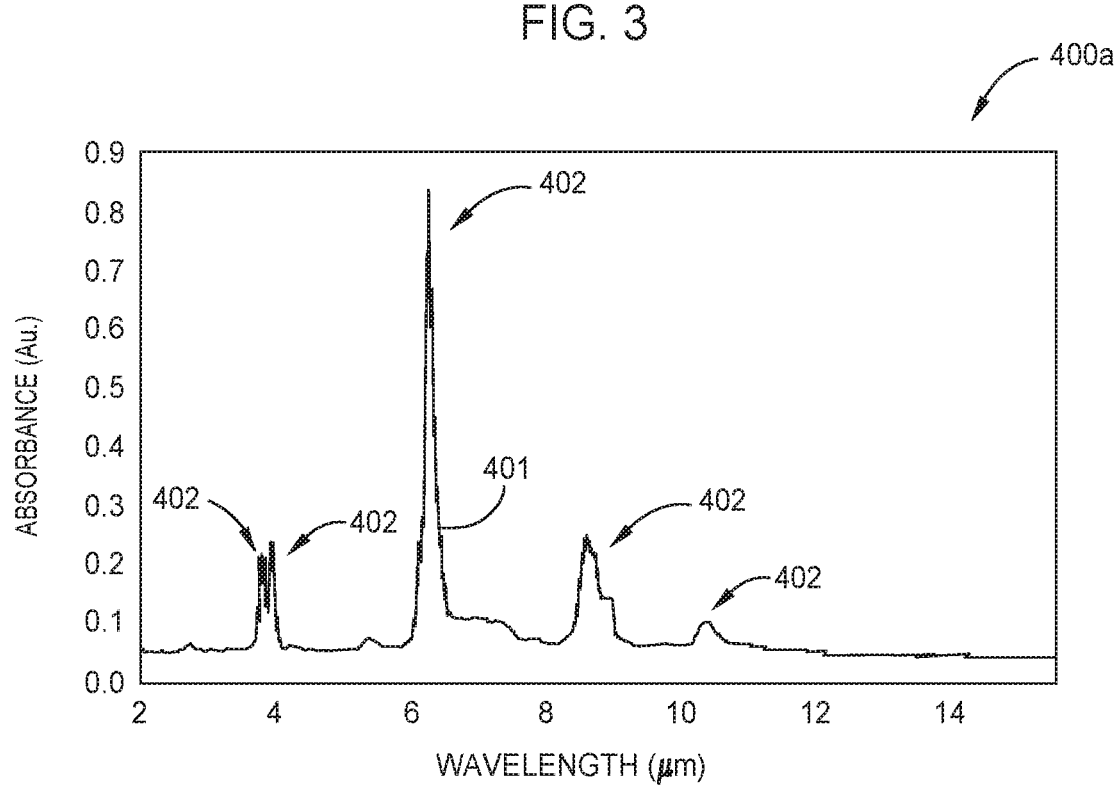
FIG. 4A is a graph illustrating the IR absorption spectrum of diborane.
Figure 4B:
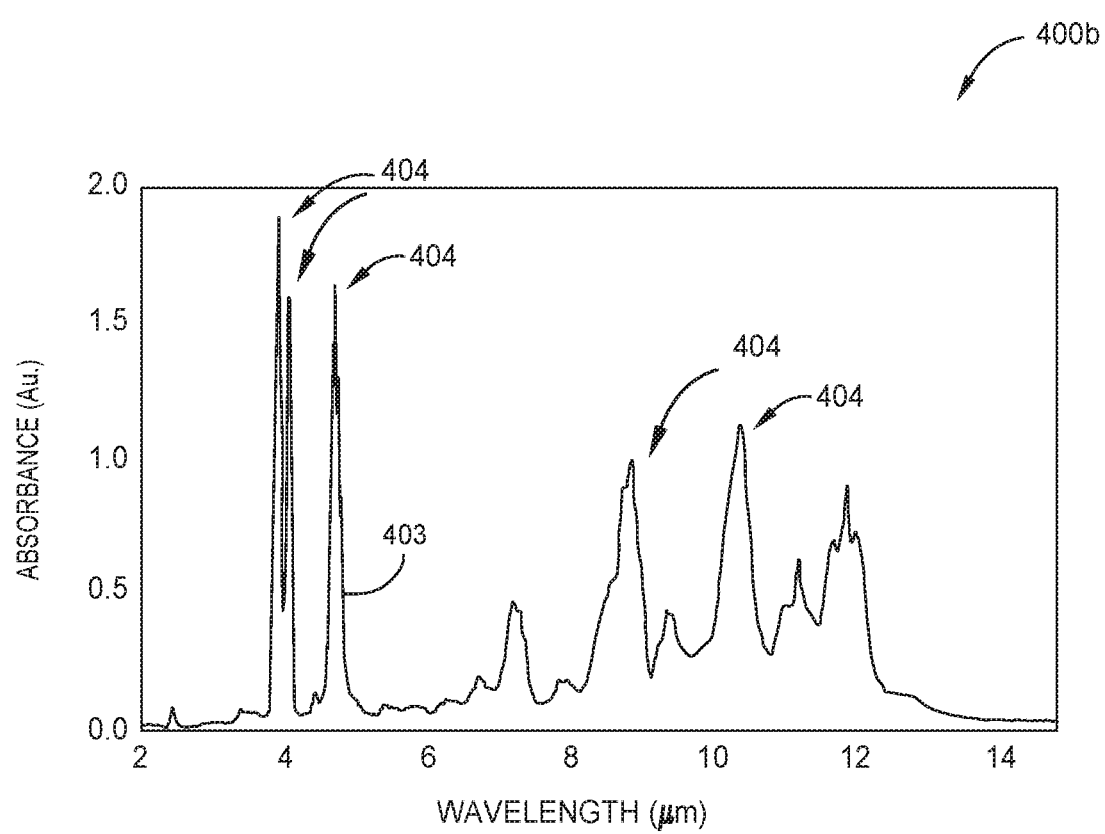
FIG. 4B is a graph illustrating the IR absorption spectrum of tetraborane.

FIGS. 2A-2B are schematic cross-sectional views of respective optical sensors 200a and 200b which may be used as one or more of the borane concentration sensors 125 described in FIG. 1, according to one embodiment. FIG. 3 is a graph 300 showing the UV absorption spectrum 301 of diborane, shown here as the absorption cross-section (cm$^2$/molecule) across a range of wavelengths (nm) in the UV spectrum. FIG. 4A is a graph 400a showing the IR absorption spectrum 401 of diborane, shown here as the absorbance (Au.) across a range of wavelengths (μm) in the IR spectrum. FIG. 4B is a graph 400b showing the IR absorption spectrum 403 of tetraborane across a range of wavelengths (μm) in the IR spectrum. As shown in FIGS. 3 and 4A the UV absorption spectrum 301 and the IR absorption spectrum 401 of diborane each comprise a respective plurality of UV absorption peaks 302 and IR absorption peaks 402. In FIG. 4B the IR absorption spectrum 403 of tetraborane comprises a plurality of IR absorption peaks 404.

Herein, one or a combination of the optical sensors 200a and 200b are used to determine the concentration of diborane, tetraborane, or both in a gas sample by selectively measuring the attenuation of a target wavelength, or target wavelengths, of radiation passing therethrough. In embodiments herein, the target wavelengths correspond to an absorption peak 302 or 402 of diborane on the UV absorption spectrum 301 or the IR absorption spectrum 401 respectively, or to an absorption peak 404 on the tetraborane IR absorption spectrum 403.

In FIG. 2A the optical sensor 200a features a body 202 and a plurality of windows (showing two windows 204a and 204b). Herein, individual ones of the plurality of windows 204a and 204b are disposed at opposite ends of the body 202 to collectively therewith define a cell volume 206. The cell volume 206 is in fluid communication with a gas inlet 208 and a gas outlet 210. The optical sensor 200 further includes a radiation source 212, one or more radiation detectors 214a-b, and one or more optical filters 216a-b. In some embodiments, the optical sensor 200, or the individual components thereof, is disposed on and electrically coupled to a printed circuit board (PCB) 217. Typically, the radiation source 212 and the one or more radiation detectors 214a-b are disposed outside of the cell volume 206 at, or proximate to, opposite ends of the body 202. For example, here the radiation source 212 is disposed outside the cell volume 206 proximate to a first window 204a at a first end of the body 202. The one or more radiation detectors 214a-b are disposed proximate to one or more optical filters 216a-b interposed between the second window 204b and the one or more radiation detectors 214a-b at, or proximate to, a second end of the body 202.

Each of the plurality of windows 204a-b is formed of a material suitable for transmission therethrough of a broad band of UV or IR radiation emitted by the radiation source 212. Examples of suitable window materials include $MgF_2$, KBr, sapphire, or combinations thereof. The broad band of UV or IR radiation emitted by the radiation source includes the target UV or IR wavelengths to be measured by the one or more radiation detectors 214a-b. In some embodiments, the radiation source 212 comprises one or more UV lamps, or one or more UV laser sources, configured to emit UV radiation comprising a wavelength of 132 nm or less, such as 115 nm or less. In other embodiments, the radiation source 212 comprises one or more IR lamps, or one or more IR laser sources, configured to emit IR radiation comprising a wavelength of 3.831 μm or more, such as 3.968 μm or more, 6.250 μm or more, 8.532 μm or more, or 10.256 μm or more. In other embodiments, the radiation source 212 comprises a UV lamp, or a UV laser source, configured to emit UV radiation comprising a wavelength of 132 nm or less, such as 115 nm or less, and an IR lamp, or an IR laser source, configured to emit IR radiation of comprising a wavelength of 3.831 μm or more, such as 3.968 μm or more, 6.250 μm or more, 8.532 μm or more, or 10.256 μm or more.

Here, a gas sample comprising diborane molecules 218, diluent gas molecules 220, and tetraborane molecules 222 flows into the cell volume 206 through the inlet 208 and flows out of the cell volume 206 through the outlet 210. In some embodiments, the optical sensor 200 is coupled to a delivery conduit, such as one of the plurality of delivery conduits 123a-c described in FIG. 1. In some embodiments, both the inlet 208 and the outlet are fluidly coupled to the delivery conduit 123a-c. In some embodiments, the outlet 210 is fluidly coupled to an exhaust conduit (not shown) which evacuates the gas sample from the cell volume 206. In some embodiments, the optical sensor 200 further includes a pressure sensor 224 fluidly coupled to the cell volume 206.

In some embodiments the optical sensor 200a is configured to determine the concentration of diborane molecules 218 in the gas sample. To determine the concentration of diborane molecules 218 in the gas sample, radiation from the radiation source 213 is simultaneously transmitted along a first optical pathway and a second optical pathway. The first optical pathway is used to selectively measure the attenuation of a target wavelength of radiation. The target wavelength of radiation corresponds to a UV absorption peak 302 (shown in FIG. 3) or an IR absorption peak 402 (shown in FIG. 4A) of the diborane molecules 218. Herein, a target wavelength corresponding to a UV absorption peak 302 is typically within about +/−2 nm of 115 nm or 132 nm. A target wavelength corresponding to an IR absorption peak 402 is typically within about +/−10 nm of 3.831 μm, 3.968 μm, 6.25 μm, 8.532 μm, or 10.253 μm.

In other embodiments the optical sensor 200a is configured to determine the concentration of tetraborane molecules 222 in the gas sample. In those embodiments, the first optical pathway is configured to selectively measure a target wavelength of radiation corresponding to an IR absorption peak 404 (shown in FIG. 4B) of the tetraborane molecules 222. Suitable target wavelengths for determining tetraborane are within +/−10 nm of an IR absorption peak 404 of the tetraborane IR absorption spectrum 403, such as within about +/−10 nm of about 4.68 μm or of about 8.85 μm.

The second optical pathway is used to selectively measure the intensity of radiation at a reference wavelength to provide a reference intensity measurement. Typically, the reference wavelength does not correspond to an absorption peak of a molecular species anticipated to be found in the gas sample. The reference intensity measurement is used to compensate for environmental, electrical, and mechanical variations which affect the first and second radiation detectors 214a-b equally, such as variations in the intensity of radiation provided by the radiation source 212 and variations of ambient pressure and temperature.

Here, the first optical pathway extends from the radiation source 212 to the first radiation detector 214a and sequentially includes the radiation source 212, the first window 204a, the cell volume 206, the second window 204b, and a first radiation detector 214a. In some embodiments, such in embodiments where the radiation source 212 is an IR radiation source, the first optical pathway further includes a first optical filter 216a disposed between the second window 204b and the first radiation detector 214a. The first optical filter 216a selectively transmits radiation in a target wavelength corresponding to an IR absorption peak 402 (FIG. 4) of the diborane molecules 218. In some embodiments the first optical filter 216a is an optical bandpass filter having a center transmission wavelength $\lambda_C$ and a bandwidth $\lambda_W$. Suitable filter center transmission wavelengths $\lambda_C$ correspond to desired target wavelengths, i.e. IR absorption peaks 402 of diborane molecules 218. In some embodiments where the optical sensor 200a is configured to determine the concentration of diborane molecules the first optical filter 216a has a center transmission wavelength $\lambda_C$ corresponding to a target wavelength of one of 3.831 μm, 3.968 μm, 6.25 μm, 8.532 μm, or 10.253 μm. In some embodiments, the center transmission wavelength $\lambda_C$ is within about +/−250 nm of the corresponding target wavelength, such as within about +/−100 nm, or for example within about +/−50 nm. In some embodiments where the optical sensor 200a is configured to determine the concentration of tetraborane molecules the first optical filter 216a has a center transmission wavelength $\lambda_{C1}$ within about +/−250 nm, about +/−100 nm, or within about +/−50 nm of an IR absorption peak 404 e.g., about 4.680 μm or about 8.850 μm. In some embodiments, the first optical filter 216a has a bandwidth $\lambda_W$ of about 1 μm or less, such as about 900 nm or less, 800 nm or less, 700 nm or less, 600 nm or less, for example about 500 nm or less.

In some embodiments, e.g., where the radiation source 212 is a UV radiation source, the first optical pathway does not include the first optical filter 216a.

Here, the second optical pathway extends from the radiation source 212 to the second radiation detector 214b and sequentially includes the radiation source 212, the first window 204a, the cell volume 206, the second window 204b, a second optical filter 216b, and the second radiation detector 214b. The second optical filter 216b selectivity transmits radiation which does not correspond to an absorption peak of diborane or a desired diluent gas. In other words, the second optical filter 216b excludes radiation wavelengths corresponding to an absorption peak of diborane or a desired diluent gas.

FIG. 2B is a schematic cross sectional view of an optical sensor 200b configured to determine the concentration of both diborane and tetraborane in a gas sample disposed therein. Here, the optical sensor 200b is similar to the optical sensor 200a described in FIG. 2a (when configured to determine diborane concentration) and further includes a third optical pathway used to determine tetraborane concentration. The third optical pathway extends from the radiation source 212, here an IR radiation source, to a third radiation detector 214c. The third optical pathway sequentially includes the radiation source 212, the first window 204a, the cell volume 206, the second window 204b, a third optical filter 216c, and the third radiation detector 214c. Here, the third optical filter 216c has a center transmission wavelength $\lambda_C$ within about +/−250 nm, about +/−100 nm, or within about +/−50 nm of an IR absorption peak 404 of tetraborane, e.g., about 4.680 μm or about 8.850 μm. In some embodiments, the third optical filter 216c has a bandwidth $\lambda_W$ of about 1 μm or less, such as about 900 nm or less, 800 nm or less, 700 nm or less, 600 nm or less, for example about 500 nm or less.

Figure 5:
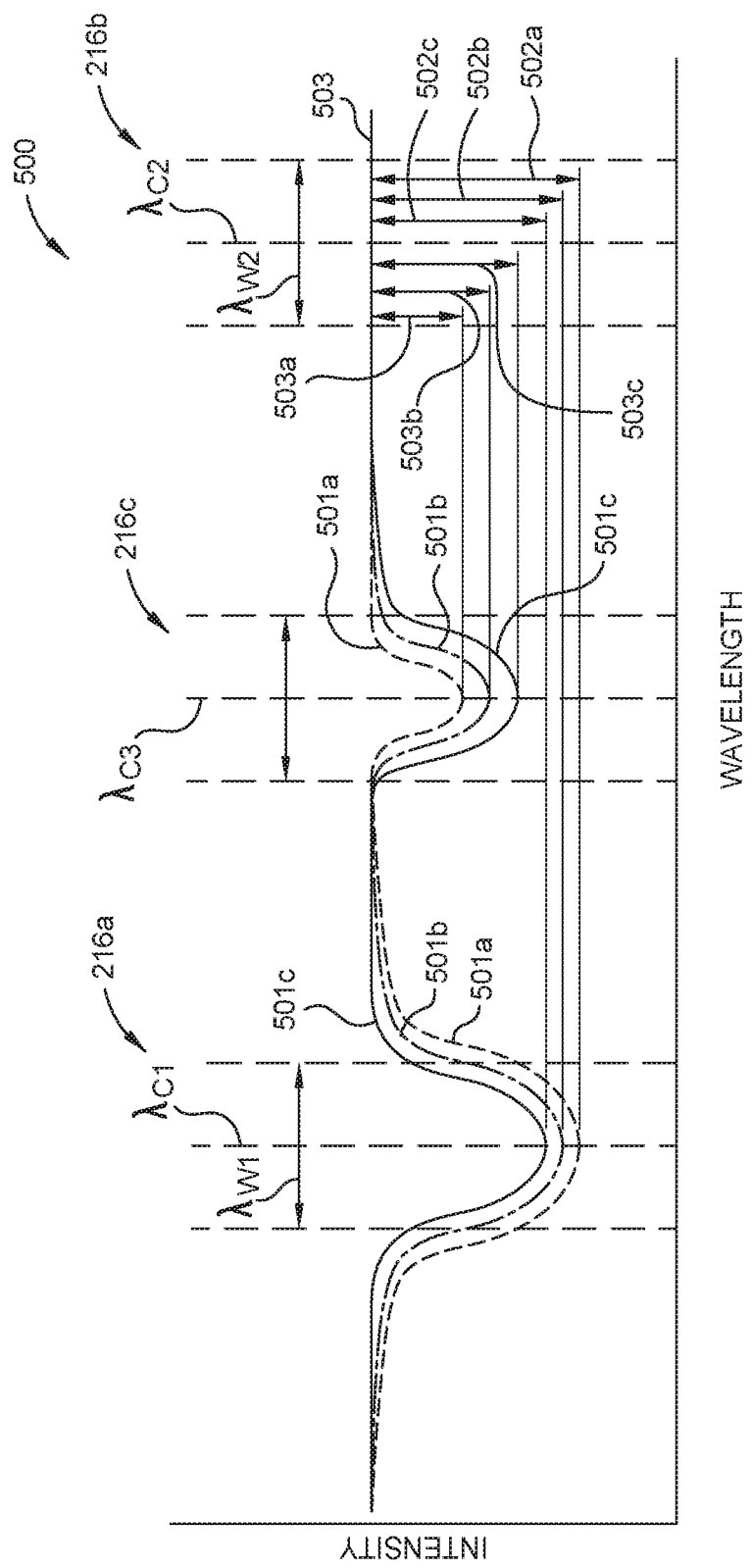
FIG. 5 is a graph schematically illustrating the attenuation of radiation passing through gas samples having various concentrations of diborane and tetraborane, according to one embodiment.

FIG. 5 is a graph 500 schematically illustrating one or more measurements taken using an optical sensor, here one of the optical sensors 200a or 200b described in FIGS. 2A and 2B respectively. Graph 500 schematically shows absorption measurements of three different gas samples 501a-c having varying concentrations of diborane. Here, radiation from the radiation source 212 is transmitted along each of the two or three optical pathways described in FIGS. 2A and 2B respectively. The optical pathways include at least the radiation source 212, the first window 204a, the cell volume 206 having one of the gas samples 501a-c disposed therein, and the second window 204b. The first optical pathway further includes the first optical filter 216a and the first radiation detector 214a. Here, the first optical filter 216a has a center transmission wavelength $\lambda_{C1}$ and a bandwidth $\lambda_{W1}$ corresponding to an IR absorption peak of diborane or tetraborane as described above and shown in FIGS. 4A and 4B respectively. The second optical pathway further includes the second optical filter 216b and the second radiation detector 214b. The second optical filter 216b has a center transmission wavelength $\lambda_{C2}$ and a bandwidth $\lambda_{W2}$ that does not correspond to an absorption peak of a molecular species anticipated to be found in the gas sample.

When used, the third optical pathway further includes the third optical filter 216c and the third radiation detector 214c. The third optical filter 216c has a center transmission wavelength $\lambda_{C3}$ and a bandwidth Awa which corresponds to an IR absorption peak of tetraborane. The center transmission wavelength $\lambda_{C2}$ of the second optical filter 216b may be more or less than the center transmission wavelength $\lambda_{C1}$ of the first optical filter 216a or the center transmission wavelength $\lambda_{C3}$ of the third optical filter 216c. Likewise, the center transmission wavelength $\lambda_{C3}$ of the third optical filter 216c may be more or less than the center transmission wavelength $\lambda_{C1}$ of the first optical filter 216a.

Typically, the intensity measurement taken by the second radiation detector 214b, i.e., the reference intensity 503, is used to compensate for environmental, electrical, and mechanical variations which affect the radiation detectors 214a-c equally. As shown, the reference intensity 503 is the same for each of the three gas samples 501a-c indicating no substantial environmental, electrical, and mechanical variations between measurements for each sample 501a-c. In some embodiments, the difference, i.e. the attenuations 502a-c, between the reference intensity 503 and the intensity for each of the samples 501a-c measured using the first radiation detector 214a is used to determine the diborane concentrations therein. As shown in FIG. 5, radiation passed through the first gas sample 501a has the highest attenuation 502a between radiation transmitted along the first and second optical pathways and thus the highest diborane concentration of the plurality of samples 501a-c. Radiation passed through the third gas sample 501c has the lowest attenuation 502c and thus the lowest diborane concentration.

Radiation passed through the first gas sample 501a has the lowest attenuation 503a between radiation transmitted along the second and third optical pathways and thus the lowest tetraborane concentration of the plurality of samples 501a-c. Because diborane in a pressurized gas cylinder decomposes over time to yield free hydrogen and tetraborane, the attenuations 503a-c measured using the third radiation detector 214c will increase as the attenuations 502a-c decrease. Thus, the radiation passed through the third gas sample 501c has the highest attenuation 503c and thus the highest tetraborane concentration of the plurality of samples 501a-c.

Figure 6A:
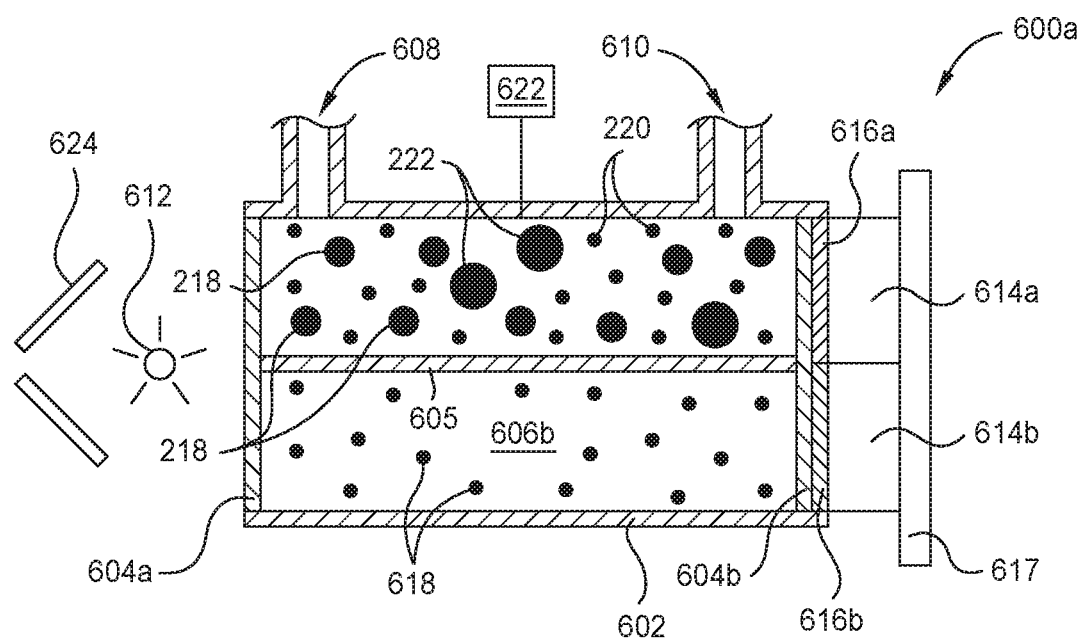
FIG. 6A is a schematic cross-sectional view of an optical sensor, according to another embodiment, which may be used with the substrate processing system described in FIG. 1.
Figure 6B:
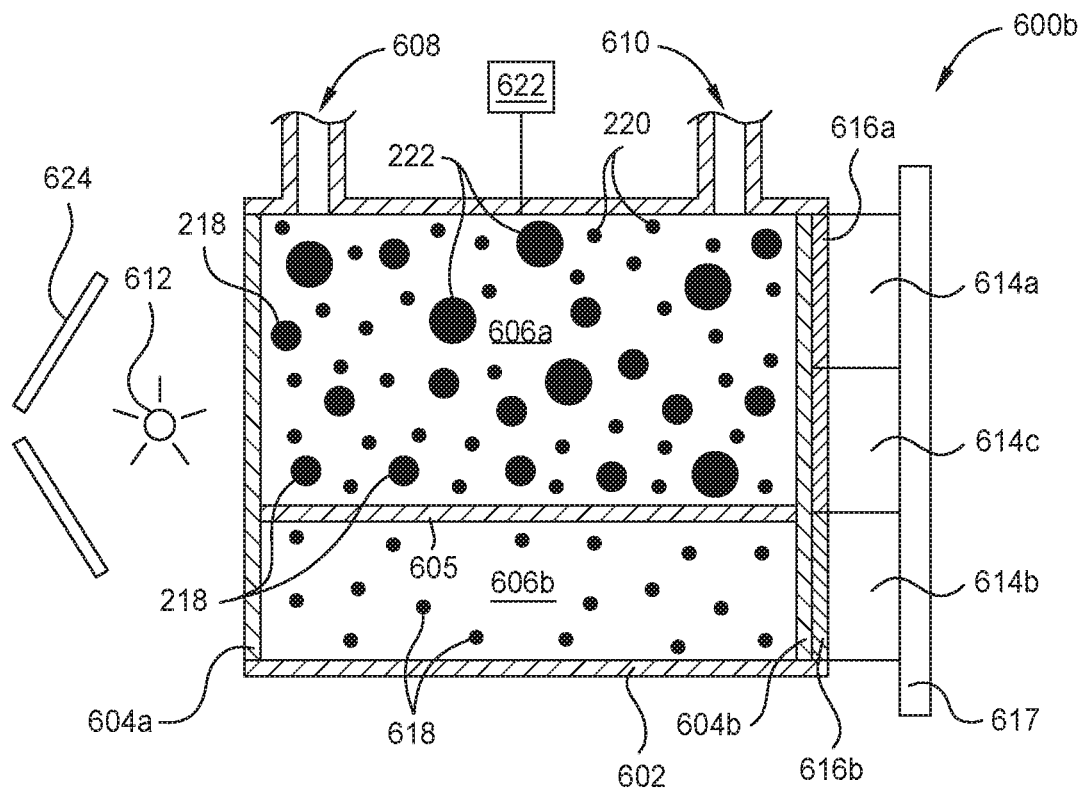
FIG. 6B is a schematic cross-sectional view of an optical sensor, according to another embodiment, which may be used with the substrate processing system described in FIG. 1.

FIGS. 6A and 6B are schematic cross-sectional views of respective optical sensors 600a and 600b which may be used as one or more of the borane concentration sensors 125 described in FIG. 1, according to another embodiment. In FIG. 6A, the optical sensor 600a features a body 602 a plurality of windows 604a-b disposed at opposite ends of the body 602, and a divider 605 which collectively define a first cell volume 606a and a second cell volume 606b. The first cell volume 606a is in fluid communication with an inlet 608, used to deliver gas samples thereinto, and an outlet 610, used to exhaust the gas samples therefrom. The second cell volume 606b is fluidly isolated from the first cell volume 606a by the divider 605 disposed therebetween. The optical sensor 600a further includes a radiation source 612, one or more radiation detectors 614a-b, and one or more optical filters 616a-b.

In some embodiments, the optical sensor 600a, or the individual components thereof, are disposed on and electrically coupled to a printed circuit board (PCB) 617. Typically, the radiation source 612 and the one or more radiation detectors 614a-b are disposed outside of the first and second cell volumes 606a-b at or proximate to opposite ends of the body 602. For example, here the radiation source 612 is disposed outside the first and second cell volumes 606a-b proximate to the first window 604a at a first end of the body 602. The one or more radiation detectors 614a-b are disposed proximate to one or more optical filters 616a-b, interposed between the second window 604b and the one or more radiation detectors 614a-b, at or proximate to a second end of the body 602.

Each of the plurality of windows 604a-b is formed of a material suitable for transmission therethrough of a broad band of UV or IR radiation emitted by the radiation source 612. Examples of suitable window materials include $MgF_2$, KBr, sapphire, or combinations thereof. The broad band of UV or IR radiation emitted by the radiation source includes the target UV or IR wavelengths to be measured by the one or more radiation detectors 614a-b. In some embodiments, the radiation source 612 comprises one or more UV lamps, or UV laser sources, configured to emit UV radiation comprising a wavelength of 132 nm or less, such as 115 nm or less. In other embodiments, the radiation source 612 comprises one or more IR lamps, or IR laser sources, configured to emit IR radiation comprising a wavelength of 3.831 μm or more, such as 3.968 μm or more, 6.250 μm or more, 8.532 μm or more, or 10.256 μm or more. I Typically, a gas sample comprising diborane molecules 218, diluent gas molecules 220, and tetraborane molecules 222 flows into the first cell volume 606a through the inlet 608 and flows out of the first cell volume 606a through the outlet 610. In some embodiments, the optical sensor 600 is coupled to a delivery conduit, such as one of the plurality of delivery conduits 123a-c described in FIG. 1. In those embodiments, the inlet 608 is fluidly coupled to the delivery conduit 123a-c and the outlet 610 is fluidly coupled to an exhaust conduit (not shown) which evacuates the gas sample from the first cell volume 606a.

To determine the concentration of diborane molecules 218 or tetraborane molecules 222 in the gas sample, radiation from the radiation source 612 is simultaneously transmitted along a first optical pathway and a second optical pathway. The first optical pathway is used to selectively measure the attenuation of a target wavelength of radiation corresponding to an UV absorption peak 302 (shown in FIG. 3) or an IR absorption peak 402 or 404 (shown in FIGS. 4A and 4B respectively) of the diborane molecules 218 or tetraborane molecules 222. The second optical pathway is used to selectively measure the intensity of radiation at a reference wavelength to provide a reference intensity measurement. Here, the reference wavelength may be the same or different from an absorption peak of a molecular species anticipated to be found in the gas sample.

Here, the first optical pathway extends from the radiation source 612 to the first radiation detector 614a. In some embodiments, e.g., where the radiation source 612 is an IR radiation source, the first optical pathway sequentially includes the radiation source 612, the first window 604a, the first cell volume 606a, the second window 604b, a first optical filter 616a, and a first radiation detector 614a. The first optical filter 616a selectively transmits radiation in a target wavelength corresponding to an IR absorption peak 402 (FIG. 4A) of the diborane molecules 218 or an IR absorption peak 404 (FIG. 4B) of the tetraborane molecules 222. Typically, the first optical filter 616a is an optical bandpass filter having a center transmission wavelength $\lambda_C$ and a bandwidth $\lambda_W$. In some embodiments, the first optical filter 216a has a center transmission wavelength $\lambda_{C1}$ corresponding to a target wavelength of diborane or tetraborane as described above and as shown in FIGS. 4A-4B respectively. In some embodiments, the first optical filter 616a has a bandwidth $\lambda_W$ of about 1 μm or less, such as about 900 nm or less, 800 nm or less, 700 nm or less, 600 nm or less, for example about 500 nm or less.

The second optical pathway extends from the radiation source 612 to the second radiation detector 614b. The second optical pathway sequentially includes the radiation source 612, the first window 604a, the second cell volume 606b, the second window 604b, a second optical filter 616b, and the second radiation detector 614b. The second optical filter 616b may allow transmission of radiation therethrough which does or does not correspond to an absorption peak of diborane or a desired diluent gas. Typically, the second cell volume 606b is maintained in a vacuum condition or comprises an inert gas 618.

In some embodiments, such as embodiments where the radiation source is a UV radiation source, one or both of the first or second optical pathways do not include a respective first or second optical filter 616a-b.

In some embodiments, the optical sensor 600a further includes a pressure sensor 622 fluidly coupled to the first cell volume 606a which is used to monitor the pressure of the gas sample disposed therein. In some embodiments, the optical sensor further includes one or more mirrors 624 used to direct radiation from the radiation source 612 through the first and second cell volumes 606a-b.

FIG. 6B is a schematic cross sectional view of an optical sensor 600b configured to determine the concentration of both diborane and tetraborane in a gas sample disposed therein. Here, the optical sensor 600b is similar to the optical sensor 600a described in FIG. 6a (when configured to determine diborane concentration) and further includes a third optical pathway used to determine tetraborane concentration. The third optical pathway extends from the radiation source 612, here an IR radiation source, to a third radiation detector 614c. The third optical pathway sequentially includes the radiation source 612, the first window 604a, the cell volume 606a, the second window 604b, a third optical filter 616c, and the third radiation detector 614c. The third optical filter 616c selectively transmits radiation in a target wavelength corresponding to an IR absorption peak 404 (FIG. 4B) of the tetraborane molecules 222 such as described above with respect to the third optical filter 216c in FIG. 2B.

In some embodiments, the optical sensors described herein are calibrated prior to installation on a processing system. Typically, the optical sensors are calibrated using a low toxicity (relative to diborane) proxy gas having a UV or IR absorption peak similar to an absorption peak of diborane. Examples of suitable proxy gases include $NH_3$, methanethiol, ethanethiol, or combinations thereof.

Figure 7:
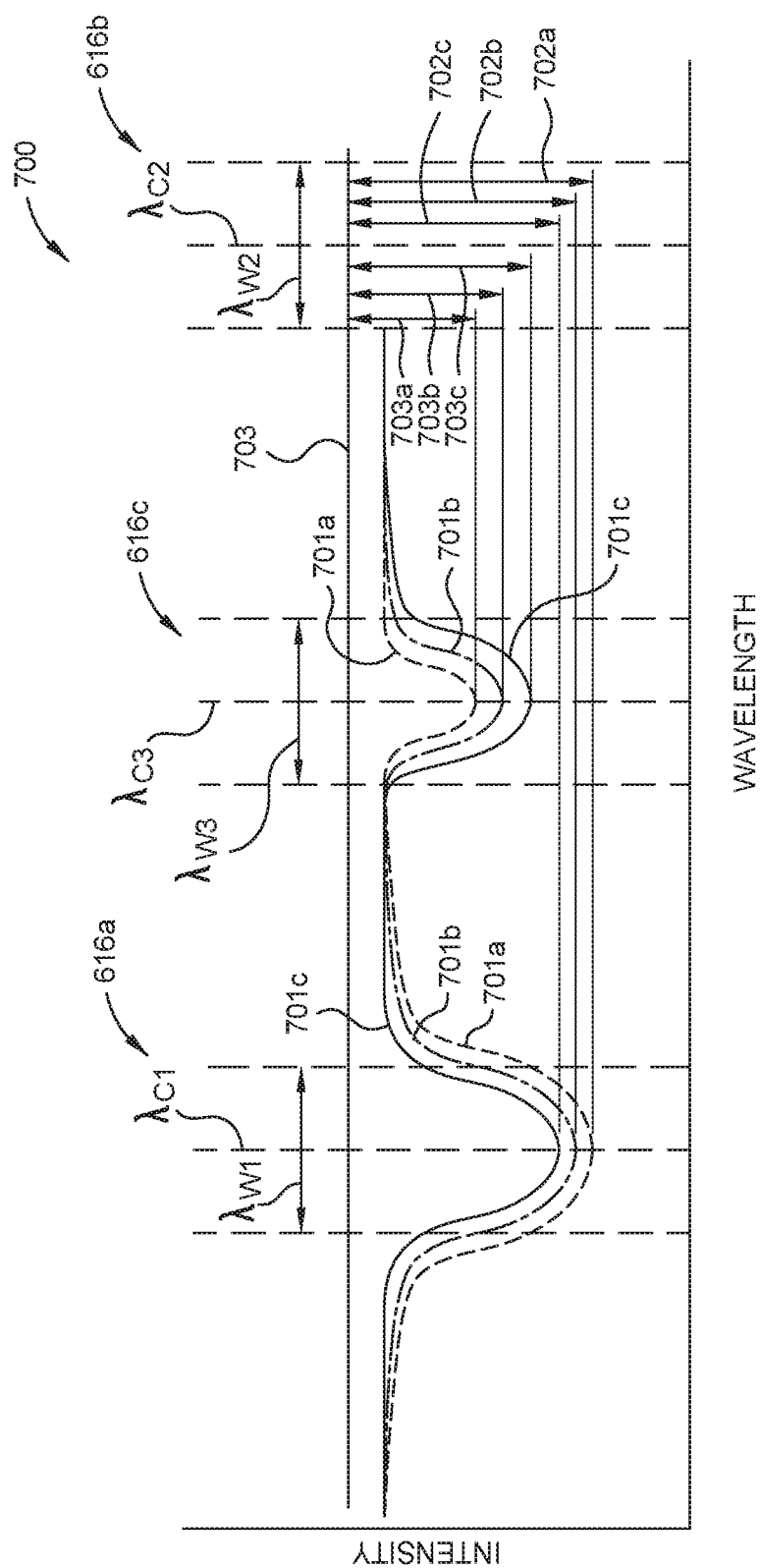
FIG. 7 is a graph schematically illustrating the attenuation of radiation passing through gas samples having various concentrations of diborane and tetraborane, according to another embodiment.

FIG. 7 is a graph 700 illustrating measurements taken using an optical sensor, here the optical sensor 600b described in FIG. 6B, of three gas samples 701a-c each having different diborane and tetraborane concentrations. Here, radiation from the radiation source 612 is transmitted along the optical pathways described in FIG. 6B. The first optical pathway includes the radiation source 612, the first window 604a, the first cell volume 606a, having one of the gas samples 701a-c disposed therein, the second window 604b, the first optical filter 616a and the first radiation detector 614a. The first optical filter 616a has a center transmission wavelength $\lambda_{C1}$ and a bandwidth $\lambda_{W1}$ corresponding to an IR absorption peak of diborane described above and shown in FIG. 4A.

The second optical pathway includes the radiation source 612, the first window 604a, the second cell volume 606b, having an inert gas 618 disposed therein, the second window 604b, the second optical filter 616b, and the second radiation detector 614b. The second optical filter 616b has a center transmission wavelength $\lambda_{C2}$ and a bandwidth $\lambda_{W1}$ that may or may not correspond to an absorption peak of a molecular species anticipated to be found in the gas sample. The third optical pathway includes the radiation source 612, the first window 604a, the first cell volume 606a, having one of the gas samples 701a-c disposed therein, the second window 604b, the third optical filter 616c and the third radiation detector 614c. The third optical filter 616c has a center transmission wavelength $\lambda_{C3}$ and a bandwidth Awa corresponding to an IR absorption peak of tetraborane described above and shown in FIG. 4B. Here, the center transmission wavelength $\lambda_{C2}$ of the second optical filter 616b may be more, less, or the same as the center transmission wavelength $\lambda_{C1}$ of the first optical filter 616a. The center transmission wavelength $\lambda_{C3}$ of the third optical filter 616c may be more or less than the center transmission wavelength $\lambda_{C1}$ of the first optical filter 616a and more or less than the center transmission wavelength $\lambda_{C2}$ of the second optical filter 616b.

Typically, the intensity measurement taken by the second radiation detector 614b, i.e., the reference intensity 703, is used to compensate for environmental, electrical, and mechanical variations which affect the first and second radiation detectors 614a-b equally. Here, the difference, i.e. the attenuations 702a-c, between the reference intensity 703 and the intensity for each of the samples 701a-c transmitted along the first optical pathway are used to determine the diborane concentration in the respective sample. The attenuations 703a-c, between the reference intensity 703 and the intensity for each of the samples 701a-c transmitted along the third optical pathway are used to determine the tetraborane concentration in the respective sample. As shown in FIG. 7, radiation passed through the first gas sample 701a has the highest attenuation 702a and thus the highest diborane concentration and the lowest attenuation 703a and thus the lowest tetraborane concentration of the three samples 701a-c. Radiation passed through the third gas sample 701c has the lowest attenuation 702c and the highest attenuation 703c and thus the lowest diborane concentration and the highest tetraborane concentration of the three samples 701a-c.

Figure 8:
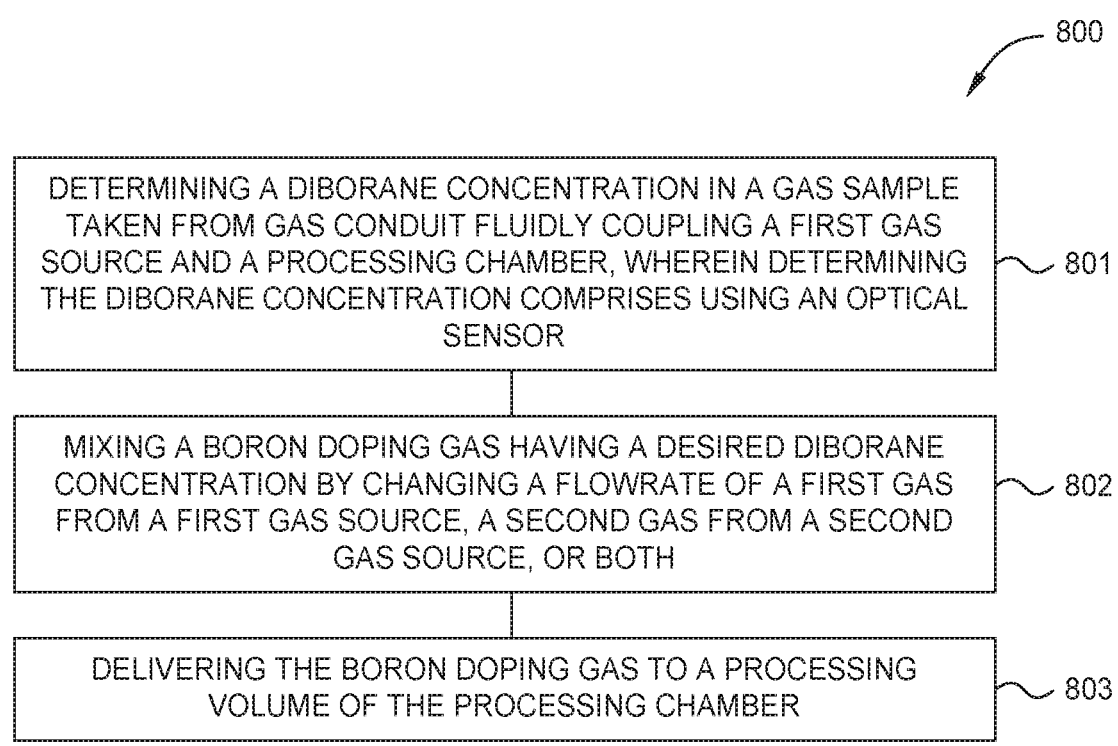
FIG. 8 is a flow diagram setting forth a method of processing a substrate, according to one embodiment.

FIG. 8 is a flow diagram setting forth a method of processing a substrate, according to one embodiment. At activity 801 the method 800 includes determining a diborane concentration in a gas sample taken from a gas conduit fluidly coupling a first gas source and a processing chamber. Here, determining the diborane concentration comprises using an optical sensor, such as one of the optical sensors 200a,b or 600a,b respectively described in FIG. 2A-2B or 6A-6B. At activity 802 the method 800 includes mixing a boron doping gas having a desired diborane concentration by changing a flowrate of a first gas from the first gas source, a second gas from a second gas source, or both. At activity 803 the method includes delivering the boron doping gas to a processing volume of the processing chamber.

In some embodiments, the method 800 further includes determining a tetraborane concentration a gas sample taken from a gas conduit fluidly coupling a first gas source and a processing chamber. In some embodiments, determining the tetraborane concentration comprises using the same optical sensor used to determine the diborane concentration or using a different optical sensor, such as using one or a combination of the optical sensors 200a, b and 600a,b described herein.

The systems and methods provided herein beneficially enable in-situ monitoring and control of diborane concentration in a boron doping gas which reduces undesirable substrate to substrate boron doping variations.

While the foregoing is directed to embodiments of the present disclosure, other and further embodiments of the disclosure may be devised without departing from the basic scope thereof, and the scope thereof is determined by the claims that follow.

The invention claimed is:

1. A borane concentration sensor, comprising:
a body;
a plurality of windows, wherein individual ones of the plurality of windows are disposed at opposite ends of the body, and wherein the body and the plurality of windows define one or more cell volumes;
a radiation source disposed outside of the cell volume and proximate to a first window of the plurality of windows;
a first radiation detector;
a first optical filter disposed between the first radiation detector and the radiation source, the first optical filter having a first center transmission wavelength $\lambda_C$ within +/−250 nm of an IR absorption peak of diborane;
a second radiation detector; and
a second optical filter disposed between the second radiation detector and the radiation source, the second optical filter having a second center transmission wavelength within +/−250 nm of an IR absorption peak of tetraborane.

2. The borane concentration sensor of claim 1, wherein the first and second radiation detectors are disposed outside of the one or more cell volumes and proximate to a second window of the plurality of windows; and
one or both of the first and second windows are formed of $MgF_2$, KBr, sapphire, or combinations thereof.

3. A method of processing a substrate, comprising:
determining, by use of an optical sensor, a diborane concentration in a gas sample taken from a gas conduit fluidly coupling a first gas source and a substrate processing chamber;
based on the determined diborane concentration, mixing a boron doping gas having a desired diborane concentration by changing a flowrate of a first gas from the first gas source, a second gas from a second gas source, or both; and
delivering the boron doping gas to a processing volume of the substrate processing chamber.

4. The method of claim 3, wherein the optical sensor comprises:
a body;
a plurality of windows, wherein individual ones of the plurality of windows are disposed at opposite ends of the body, and wherein the body and the plurality of windows define a cell volume;
a radiation source disposed outside of the cell volume and proximate to a first window of the plurality of windows; and
a first radiation detector disposed outside the cell volume and proximate to a second window of the plurality of windows.

5. The method of claim 4, wherein one or both of the first and second windows are formed of $MgF_2$, KBr, sapphire, or combinations thereof.

6. The method of claim 4, wherein the optical sensor further comprises a second radiation detector.

7. The method of claim 4, wherein the optical sensor further comprises a first optical filter interposed between the first radiation detector and the second window.

8. The method of claim 7, wherein the first optical filter has a center transmission wavelength $\lambda_C$ within +/−250 nm of an IR absorption peak of diborane or within +/−250 nm of an IR absorption peak of tetraborane.

9. The method of claim 7, wherein the optical sensor further comprises a second radiation detector and a second optical filter disposed between the radiation source and the second radiation detector, wherein the first optical filter has a center transmission wavelength $\lambda_C$ within +/−250 nm of an IR absorption peak of diborane and the second optical filter has a center transmission wavelength within +/−250 nm of an IR absorption peak of tetraborane.

10. A processing system comprising:
a computer readable medium having instructions stored thereon for a method of processing a substrate, comprising:
determining, by use of an optical sensor, a diborane concentration in a gas sample taken from a gas conduit fluidly coupling a first gas source and a substrate processing chamber;
based on the determined diborane concentration, mixing a boron doping gas having a desired diborane concentration by changing a flowrate of a first gas from the first gas source, a second gas from a second gas source, or both; and
delivering the boron doping gas to a processing volume of the substrate processing chamber.

11. The processing system of claim 10, wherein the optical sensor comprises:
a body;
a plurality of windows, wherein individual ones of the plurality of windows are disposed at opposite ends of the body, and wherein the body and the plurality of windows define a cell volume;

a radiation source disposed outside of the cell volume and proximate to a first window of the plurality of windows; and a first radiation detector disposed outside the cell volume and proximate to a second window of the plurality of windows.

12. The processing system of claim 11, wherein one or both of the first and second windows of the optical sensor are formed of $MgF_2$, KBr, sapphire, or combinations thereof.

13. The processing system of claim 11, wherein the optical sensor further comprises a first optical filter interposed between the first radiation detector and the second window.

14. The processing system of claim 13, wherein the first optical filter has a center transmission wavelength $\lambda_C$ within +/−250 nm of an IR absorption peak of diborane or within +/−250 nm of an IR absorption peak of tetraborane.

15. The processing system of claim 13, wherein the optical sensor further comprises a second radiation detector and a second optical filter disposed between the radiation source and the second radiation detector, wherein the first optical filter has a center transmission wavelength $\lambda_C$ within +/−250 nm of an IR absorption peak of diborane and the second optical filter has a center transmission wavelength within +/−250 nm of an IR absorption peak of tetraborane.

16. The processing system of claim 15, further comprising the substrate processing chamber.

17. The processing system of claim 15, wherein the method further comprises determining a tetraborane concentration in the gas sample using the optical sensor.

* * * * *